United States Patent [19]

Anderl et al.

[11] 4,028,523

[45] June 7, 1977

[54] ENERGY-BEAM ENGRAVING METHOD AND AN APPARATUS FOR CARRYING IT OUT

[75] Inventors: Peter Anderl; Monika Geffcken; Joachim Geissler, all of Munich, Germany

[73] Assignee: Steigerwald Strahltechnik GmbH, Germany

[22] Filed: Dec. 9, 1975
(Under Rule 47)

[21] Appl. No.: 639,127

[30] Foreign Application Priority Data

Dec. 10, 1974 Germany ............................ 2458370

[52] U.S. Cl. .................. 219/121 EM; 219/121 LM
[51] Int. Cl.² ............................................ B23K 9/00
[58] Field of Search ............ 219/121 EB, 121 EM, 219/121 L, 121 LM; 346/76 L; 178/6.6 B

[56] References Cited

UNITED STATES PATENTS

| | | |
|---|---|---|
| 3,378,670 | 4/1968 | Smith et al. ................ 219/121 EM |
| 3,455,239 | 7/1969 | Smith ..................... 219/121 EM X |
| 3,549,733 | 12/1970 | Caddell ..................... 178/6.6 B X |
| 3,626,143 | 12/1971 | Fry .............................. 219/121 LM |
| 3,636,251 | 1/1972 | Daly et al. ..................... 178/6.6 B |
| 3,931,458 | 1/1976 | Dini ................................ 178/6.6 B |

Primary Examiner—J. V. Truhe
Assistant Examiner—Fred E. Bell
Attorney, Agent, or Firm—Russell & Nields

[57] ABSTRACT

The specification describes an energy-beam engraving method for producing depressions of different dimensions in a surface. In the method depressions with smaller and larger dimensions are produced by shorter and longer action of an energy beam with a substantially constant power. Besides the duration of action of the energy-beam on a predetermined range of the surface to be engraved simultaneously its focussing is so varied that the focus plane is closer to the surface in the case of smaller depressions than with larger depressions.

4 Claims, 3 Drawing Figures

U.S. Patent
June 7, 1977
4,028,523
FIG.1
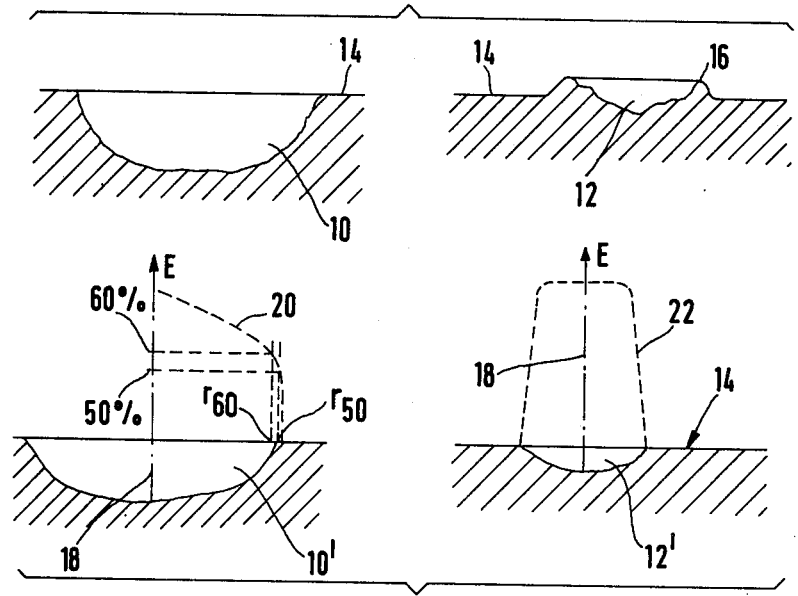
FIG.2
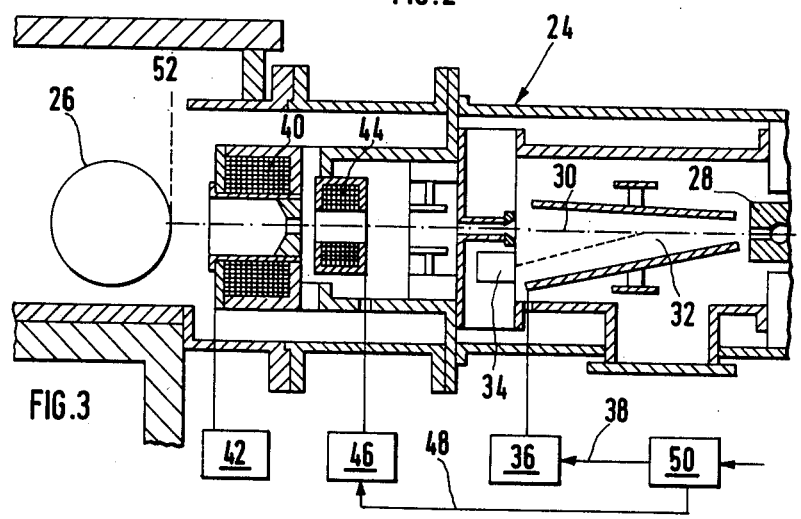
FIG.3

ENERGY-BEAM ENGRAVING METHOD AND AN APPARATUS FOR CARRYING IT OUT

BACKGROUND OF INVENTION

1. Field to which invention relates

The present invention relates to an energy beam engraving method for the production of pit-shaped depressions of different dimensions in the surface of a workpiece, in the case of which depressions with smaller and, respectively, larger dimensions are produced by shorter and, respectively, longer lasting action of an energy beam, more particularly a charge carrier beam and preferably of an electron beam with a pre-established and substantially constant power, which is focussed in a plane at the surface to be engraved.

Furthermore the invention relates to an apparatus for carrying out such a method.

2. The prior art

The German Patent Specification (Auslegeschrift) No. 1,123,561, the U.S. Pat. No. 3,246,079, the East German Patent Specification No. 55,965 and the German Patent Specification (Offenlegungsschrift) No. 2,111,628 have already described methods for the production of gravure or intaglio forms by means of an electron beam, with which pit-shaped depressions (in what follows referred to as "pits" for short) of the most various different shapes can be produced. In this respect the following parameters of the energy-beam can be controlled: beam intensity, the size and shape of the hot spot, the position of the hot spot, intensity distribution, movement of the hot spot and length of action. In the case of the production of smaller and larger pits of a predetermined type however generally only one of these parameters is varied as for example the intensity or the duration of action of the charge carrier beam. The variation in the beam sharpness or focus, which is described in the German Patent Specification No. 1,123,561 is practically equivalent to a change in cross-section.

Furthermore the German Patent Specification (Offenlegungsschrift) No. 2,207,090 refers to the production of round and rhombic pits by means of a charge carrier beam with an elliptical cross-section, in the case of which the axial ratio can be controlled by means of a stigmator. The cross-sectional area of the engraving charge carrier beam is generally substantially smaller than that of the pit to be engraved. During engraving the operation is started at one edge or at the one corner of the pit with a practically punctuate focussing of the charge carrier beam and the matter is then deflected over the area of the pit and distorted in an elliptical or line-like manner up to a maximum size and then reduced in size again.

The engraving of the pits becomes substantially simpler as regards complexity of apparatus and the control of the apparatus if the energy-beam does not need to be deflected during engraving a predetermined pit and if in the case of all pit sizes it is possible to operate with the same beam power. If however, as is suggested for example in the East German Patent Specification 55,965, the beam power is held constant and the varying dimensions of the pits are only produced by a suitable control of the duration of action, it is necessary in practice to make compromises as regards the beam parameters and such compromises involve substantial disadvantages. More especially in the case of small pits there is a substantial formation of flash at the edge of each pit and the bottoms of the pits become irregular. Furthermore there is a tendency of the pit diameter to become too small in the case of light shades.

SUMMARY OF INVENTION

One aim of the present invention is therefore that of affording an energy-beam engraving method in the case of which independently of the size of the different pits an even sherical segment shape of the pits, a smooth pit bottom and a flash-free edge are ensured.

This aim is achieved by the present invention by carrying out the following steps: directing an energy beam successively onto a plurality of discrete positions on said workpiece surface, said energy beam being adapted to produce a depression in said workpiece surface the depth and area of which increases with increasing dwell time, controlling the dwell time upon each position so as to produce smaller depressions and larger depressions, focusing said beam in a focus plane which lies within said workpiece in the vicinity of said workpiece surface, and controlling the focus of said beam so that said focus plane is nearer to the surface during production of said smaller depressions than during production of said larger depressions.

The pit-shaped depressions produced by the method in accordance with the invention have an even spherical segment shape independently of their size and also possess a smooth bottom and a flash-free edge. Since the power of the energy beam is independent of the size of the pits to be produced and can therefore be kept constant, the present method produces results with a high degree of reproducibility and even in the case of long periods of engraving it is possible to ensure a constant functional connection between the shade value signal controlling the engraving apparatus and the pit size.

The present invention includes methods of engraving a workpiece by producing depressions therein wherein said depressions are pit-like and have diameters and depths which lie between a minimum value and a maximum value, and wherein the focus plane is displaced with increasing pit depth from one position in or immediately adjacent to the workpiece surface further and further into the interior of the workpiece.

The present invention also includes methods of engraving a workpiece wherein the focussing is so controlled that the energy density in the beam cross-section is at least approximately constant in the case of a small depth of engraving, while in the case of a large depth of engraving it decreases with an increase in distance from the beam axis.

The present invention also includes methods of engraving a workpiece wherein the energy density is at least 15% larger in the centre, in the case of a large depth of engraving, than in the case of half the half value breadth.

The present invention also includes apparatus for carrying out the above-mentioned methods.

In what follows embodiments of the invention will be described in more detail with reference to the accompanying drawing.

FIG. 1 shows considerably enlarged cross-sectional views of two pit-shaped depressions as produced in accordance with a prior art method.

FIG. 2 shows cross-sectional views of two corresponding depressions, which have been produced by the present method.

FIG. 3 shows a simplified view of a device for carrying out the present method.

DESCRIPTION OF PREFERRED EMBODIMENTS

FIG. 1 shows two pits 10 and 12, which have been produced in the surface 14 of an intaglio printing cylinder by means of a focussed electron beam. The pit 10 corresponds to the density or shade value 1.5 while the pit 12 is to correspond to the shade value 0.05. In the case of the production of the pit 10 the engraving electron beam acts in accordance with the prior art for a longer time than on production of the pit 12 but in other respects the beam parameter are the same in the case of the production of the two pits.

While the pit 10 is satisfactory, the pit 12 has a projecting flash 16 at the edge and the bottom of the pit is comparatively irregular.

Similar results are obtained if not only the duration of action but also the beam intensity (beam power) is varied proportionally to the pit size.

It has now been found that the flash formation occurring in the case of the smaller pits can be avoided, without having to sacrifice the advantage of the beam power which is constant independently of the pit size, if the focussing of the engraving energy beam is so changed that the focussing plane is closer to the surface to be engraved in the case of smaller pits than is the case with larger pits. If, as is the case with engraving intaglio printing forms in general, the pit size lies between a lower and an upper limit, the energy beam on engraving pits, whose size corresponds to the lower limit of the size range, is focussed substantially into the surface of the workpiece to be engraved and the image plane is displaced with increasing pit size further and further into the interior of the workpiece. Owing to this feature it is possible to obtain, as is shown diagrammatically in FIG. 2, pits 10' and, respectively, 12' of different depths and different diameters, which have a smooth bottom and are free of flash at the edge.

Preferably in the case of the production of all pits the operation is carried out with energy beams, which have very steep flanks. Preferably the radius $r_{60}$ struck at the centre axis 18 of the beam (FIG. 2), at which the beam energy has been reduced to 60% of the maximum value, should be at least 0.95 $r_{50}$, in the case of which $r_{50}$ denotes the radius, at which the beam energy has been reduced to 50% of its maximum value.

Preferably the energy distribution is so controlled as a function of the pit size that in the case of large depths of engraving it increases from the radius $r_{60}$ in the manner of a dome or roof towards the beam axis, while in the case of small engraving depths it is more satisfactory if the current density remains practically constant over the whole area of the pit. Examples for satisfactory energy distributions are represented in FIG. 2 for the pit 10' and the pit 12' by the curves 20 and 22 respectively indicated in broken lines.

FIG. 3 shows a preferred electron beam engraving apparatus for carrying out the method as explained above. The apparatus in accordance with FIG. 3 comprises an evacuatable housing 24, in which the workpiece to be engraved, for example an intaglio printing machine cylinder 26 is arranged. The housing is connected in a conventional manner with a vacuum producing plant, not represented, and comprises a beam producing system 28, which is only partly and diagrammatically represented. This system 28 produces an electron beam 30. The acceleration voltage and the emission current density of the electron beam lie within conventional limits and can amount for example to 20 to 100 kV and 10 to 100 milliampere and preferably 50 kV/50 milliampere. The beam current effective at the workpiece amounts to 0.2 to 0.8 times the emission current and preferably amounts to 0.3 to 0.5 times this current. Upstream from the beam producing system 28 in the beam direction there is an electrostatic deflecting arrangement with two deflecting plates, by means of which the beam is deflected out of the axial position as shown in broken lines, in which it impinges on the workpiece, into a deflected position which is indicated by dotted lines, in which it impinges on a catching means 34. The deflecting arrangement is supplied by a deflecting circuit 36 and makes it possible, together with the latter, to control the duration of action of the electron beam on the workpiece in accordance with a control signal supplied to the deflecting circuit via a line 38.

The electron beam 30 is coarsely focussed by means of a main focussing coil 40, which is connected with an adjustable current source 42. Fine focussing and changing of the focussing setting in accordance with the depth of engraving and, respectively, dimensions of the pits to be produced is carried out with a focussing coil 44, which is connected with a controllable current source 46. The current source 46 can be controlled by a control signal, which is supplied to it via a line 48.

The control signals on the lines 38 and 48 are produced by a control signal source 50, which has supplied to it a screen dot signal produced in a conventional manner.

Preferably the electron beam is focussed by the main focussing coil 40 in one plane, which corresponds to the maximum or minimum value respectively of the depth of engraving or pit size. The current in the auxiliary focussing coil 44 is then controlled in accordance with the screen dot signal in such a manner that the above mentioned relationship between the position of the focussing plane and the pit size is produced. It is possible for example to focus the beam by means of the main focussing coil 40 in the plane 52, which passes through the point of intersection of the beam axis with the surface of the workpiece. The control signal source 50 is then so set in conjunction with the current source 46 that this focussing is effective for the minimum pit size and, respectively, depth and with the result that the focussing plane becomes further and further removed from the plane 52 with an increase in pit size and preferably in this respect it should move into the workpiece, that is to say towards the condition of underfocussing.

In the case of a practical embodiment of the invention the effective distance between the focussing lens and the surface of the intaglio printing cylinder to be engraved amounted to approximately 90 mm. The screen dots or pits to be engraved had diameters between 30 microns and 120 microns. In the case of electron beam engraving of the pits with the smallest diameter (30 microns) the focal point of the electron beam lay in the surface of the intaglio printing cylinder or up to a few tens of microns below it, while in the case of engraving of the largest pits (120 microns) the focal point lay approximately 1 mm underneath the surface. In the case of a change in the pit size by a factor of 4 the effective focal length of the focussing lens system therefore amounted to approximately 1 percent.

The above mentioned change in the energy distribution in the beam cross-section can be brought about by suitable design of the lens system and the electron beam source and/or by additional electron-optic means not represented, such as stigmator coils or the like.

In lieu of an electron beam it is naturally also possible to use an ion beam or a beam of electromagnetic energy, more particularly a laser beam. It is also possible to change the focussing of the electron beam 30 or another charge carrier beam by means of the main focussing coil 40; generally however it will be more convenient to bring about the change in the focussing in accordance with the depth of engraving by the use of a separate auxiliary focussing coil with a small inductance.

Since the beam power is independent of the depth of engraving, the beam voltage and the beam current can be regulated in a conventional manner.

What we claim is:

1. A method of energy beam engraving a workpiece having a workpiece surface comprising the following steps: directing an energy beam successively onto a plurality of discrete positions on said workpiece surface, said energy beam being adapted to produce a depression in said workpiece surface the depth and area of which increases with increasing dwell time, controlling the dwell time each position so as to produce smaller depressions and larger depressions, focusing said beam in a focus plane which lies within said workpiece in the vicinity of said workpiece surface, and controlling the focus of said beam so that said focus plane is nearer to the surface during production of said smaller depressions than during production of said larger depressions.

2. A method in accordance with claim 1 wherein said depressions are pit-like and have diameters and depths which lie between a minimum value and a maximum value, and wherein said focus plane is displaced with increasing pit depth from one position in or immediately adjacent to said workpiece surface further and further into the interior of said workpiece.

3. A method in accordance with claim 1 wherein the focussing is so controlled that the energy density in the beam cross-section is at least approxiamtely constant in the case of a small depth of engraving, while in the case of a large depth of engraving it decreases with an increase in distance from the beam axis.

4. A method in accordance with claim 3 wherein the energy density is at least 15% larger in the centre, in the case of a large depth of engraving, than in the case of half the half value breadth.

* * * * *